United States Patent [19]
Ku et al.

[11] Patent Number: 6,136,665
[45] Date of Patent: Oct. 24, 2000

[54] METHOD FOR FORMING A RECESS-FREE BUFFER LAYER

[75] Inventors: Chi-Fa Ku, Kaohsiung; Jain-Hon Chen, Chiayi, both of Taiwan

[73] Assignee: United Microelectronics Corp., Hsinchu, Taiwan

[21] Appl. No.: 09/089,371

[22] Filed: Jun. 3, 1998

[51] Int. Cl.[7] .......................... H01L 21/76; H01L 21/469
[52] U.S. Cl. .......................... 438/438; 438/404; 438/428; 438/436; 438/760; 438/781
[58] Field of Search ...................................... 438/760, 761, 438/698, 632, 646, 759, 780, 781, 958, 955, 438, 403, 404, 428, 436, 638

[56] References Cited

U.S. PATENT DOCUMENTS

| | | | |
|---|---|---|---|
| 4,665,007 | 5/1987 | Cservak et al. | 430/311 |
| 4,799,992 | 1/1989 | Rao et al. | 156/643 |
| 5,302,548 | 4/1994 | Watanabe et al. | 437/187 |
| 5,656,556 | 8/1997 | Yang | 438/646 |

*Primary Examiner*—John F. Niebling
*Assistant Examiner*—Ha Tran Nguyen

[57] ABSTRACT

A recess-free buffer layer is formed on a semiconductor substrate having island structures formed thereon. A first buffer layer is formed over the substrate and the island structures. A first reflow process is then performed for reflowing the first buffer layer into spaces between the island structures. A portion of the first buffer layer located outside the spaces is removed. A second buffer layer is formed over the first buffer layer and the island structures. The method can further include a step of performing a second thermal soft-bake process to the second buffer layer. The second buffer layer can also be patterned after the soft-bake process.

16 Claims, 6 Drawing Sheets

METHOD FOR FORMING A RECESS-FREE BUFFER LAYER

FIELD OF THE INVENTION

The present invention relates to the semiconductor manufacturing process, and more specifically, to a method of forming a recess-free buffer layer. A polyimide layer can be formed over conductive structures with a planar and recess-free top surface.

BACKGROUND OF THE INVENTION

From the birth of the first integrated circuits in 1960, the number of devices on each chip has increased at an explosive rate. The progress of the semiconductor integrated circuits has led to an ULSI (ultra large scale integration) or even higher level after four decades of development. The capacity of a single semiconductor chip increases from several thousand devices to hundreds of million devices, or even billions of devices. Integrated circuit devices such as transistors, capacitors, and connections must be greatly narrowed accommodate these advancements.

However with the narrowing of feature sizes, a great number of challenges arise at the same time. The narrowed spaces between a lot of structures or individual devices are hard to be filled by subsequently formed layers. The unfilled spaces lead to the problems of hollow defects. In some cases, the layer covered over the hollow spaces might reflow in a later process and cause undesired topographical problems.

Without limiting the scope of the present invention, an example of a polyimide layer over conductive structures is illustrated as the background of the invention. The recess problems can be found with the formation of a subsequent layer over a non-planar surface and other various cases are not described in detail.

Turning to FIG. 1A, a top view of a portion of a semiconductor substrate with structures formed over is illustrated. Conductive structures M1 and M2 are formed thereon and the figure is shown with a portion of the conductive structure layout at a comer or turn-around region. A cross-sectional view along line B-B' is shown in FIG. 1B. In general, a passivation layer 12 is formed over the conductive structures to act as conductive path passivations. With the narrow space 14 between the conductive structures M1 and M2, the two mushroom passivation film merge to form an unopened hole in-between.

Referring to FIG. 1C, a cross-sectional view along line C-C' in FIG. 1A is shown. At the corner region where conductive structures M1 and M2 turn around, the width 16 between M1 and M2 is wider than the width of the space 14 between the two straight paths. Therefore, an unfilled and top-opened space 18 is left after the formation of the passivation layer 12.

Typically, a buffer layer 20 is formed over a last layer of the interconnection layers, namely the layer with conductive structures M1 and M2, as shown in FIG. 2. The buffer layer is used as a protection layer over the whole chip to reduce the stress-induced damage or cracks in the chip-packaging process. In general, organic polymer materials like polyimide are used as the buffer layer 20. With only a small top opening in the narrow space 18, a subsequently formed buffer layer 20 is hard to fill in and the space 18 is left unfilled.

However with a later thermal process like a soft-bake process, the buffer layer is heated and reflow can occur. The space 18 might be filled and a recess region 22 is formed on the top surface of the buffer layer 20, as shown in FIG. 3. The undesired formation of the recess region 22 can be observed by an optical microscope inspection step. In the inspection with a top view of the substrate, the recess region 22 observed is a dark region or a black point, as shown in FIG. 4.

Typically, the recess region on the surface of the buffer layer is caused by material redistribution in the reflow process. Thus, a plurality of recess regions can be present on a wafer at regions such as the turn-around regions of the conductive structures, or the end-point of the conductive structures.

In inspection processes such as ADI (after development inspection), AEI (after etching inspection), etc., the presentation of dark regions or black points are usually mis-identified as defects and cause the substrate to be identified as defective. The wrongly identified substrate or wafer is sent to a rework process. Thus the yield of the process is greatly damaged and unnecessary inspection efforts and rework process efforts are increased.

What is needed is a method to form a planar and recess-free layer, especially on a non-planar surface with island structures.

SUMMARY OF THE INVENTION

A method of forming a recess-free buffer layer is provided in the present invention. Conventional non-planar substrate surface with island structures can be covered with a buffer layer having a recess-free top surface. Thus the presentation of the dark regions or the black points in the inspection process is eliminated. The inspection efforts can be reduced and the rework process efforts are greatly reduced thereby.

The method of the present invention forms a recess-free buffer layer on a semiconductor substrate. The substrate has island structures formed thereon. The method includes steps as follows. First, a first buffer layer is formed over the substrate and the island structures. A reflow process is then performed for reflowing the first buffer layer into spaces between the island structures. A portion of the first buffer layer located outside the spaces is then removed. A second buffer layer is formed over the first buffer layer and the island structures.

The method further includes a step of performing a second thermal soft-bake process to the second buffer layer. The second buffer layer can also be patterned after the soft-bake process.

DETAILED DESCRIPTION OF THE PREFERRED EMBODIMENT

The present invention discloses a method for forming a recess-free buffer layer. By forming and reflowing a first buffer layer, spaces between island structures can be filled. A clean process can be utilized to clean a portion of the first buffer layer outside the island-to-island spaces. Thus a second buffer layer can be formed with a recess-free top surface. A good topography is provided and the efforts in the inspection process can be reduced.

Without limiting the scope and the spirit of the present invention, an example of forming a polyimide layer over conductive structures is illustrated in detail. Upon acknowledging the method of the present invention, a person skilled in the art can apply the method to forming a recess-free layer with various materials on a surface with island structures. The other various applications on solving the recess problems with variations in the materials and the island structures are thus not described in detail.

Figure 1A:
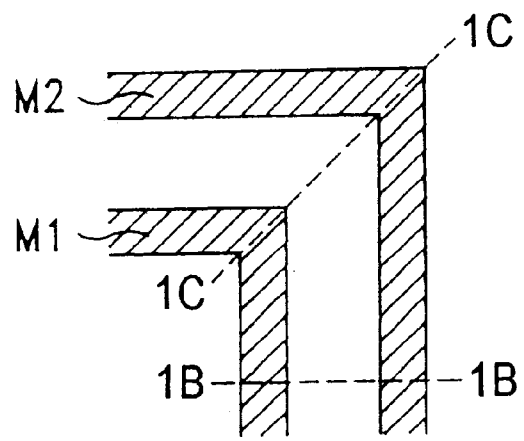
FIG. 1A is a top view of a prior art semiconductor substrate with conductive structures formed over.
Figure 1B:
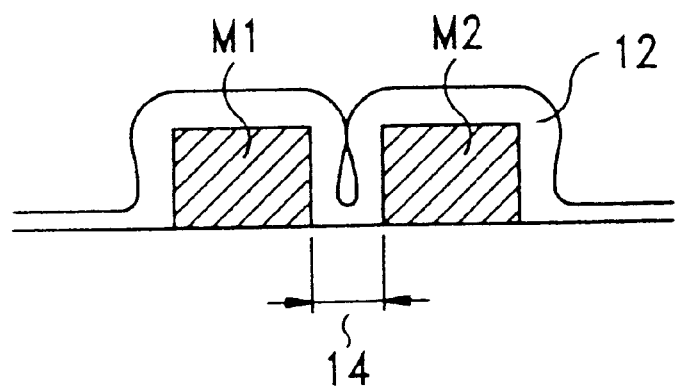
FIG. 1B is a cross-sectional view of the prior art substrate along line B-B' in FIG. 1A.
Figure 1C:
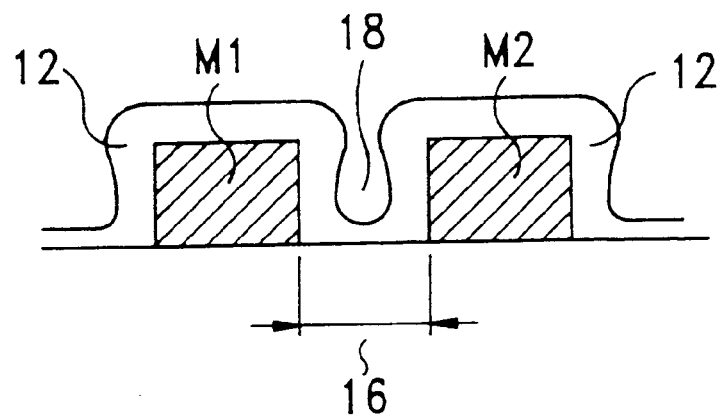
FIG. 1C is a cross-sectional view of the prior art substrate along line C-C' in FIG. 1A.
Figure 2:
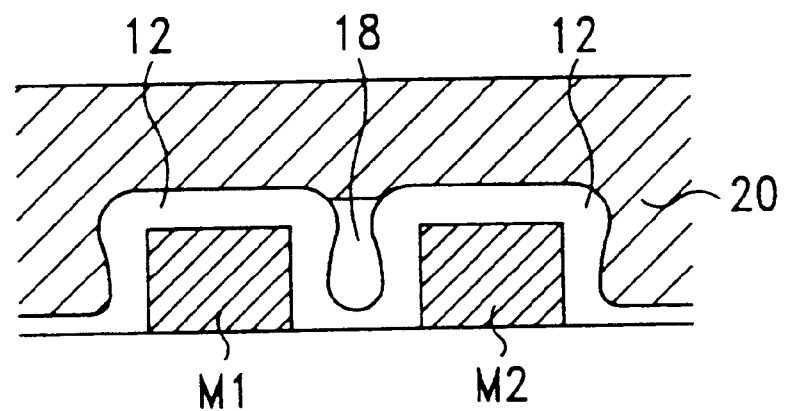
FIG. 2 is a prior art cross-sectional view of forming a buffer layer over the substrate and the conductive structures.
Figure 3:
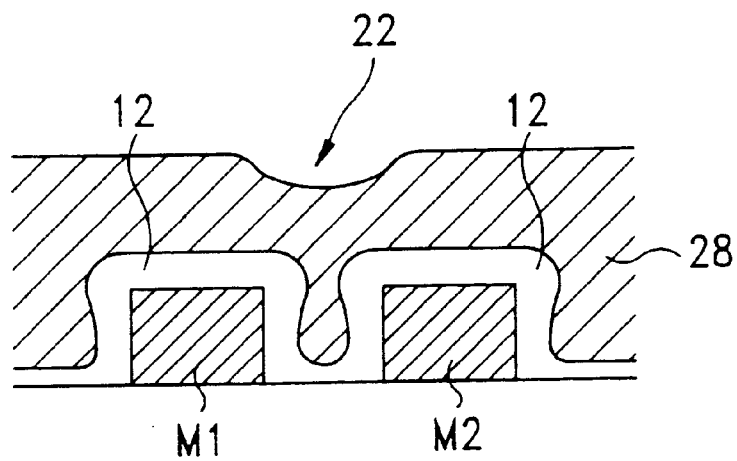
FIG. 3 is a prior art cross-sectional view of the formation of a recessed region on the buffer layer.
Figure 4:
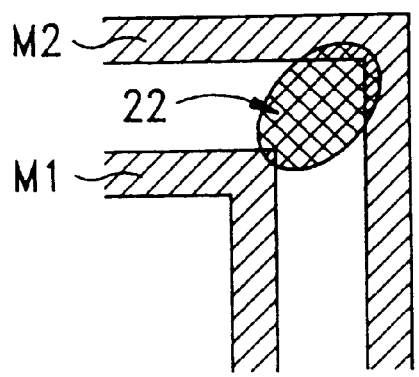
FIG. 4 is a prior art top view of the presentation of a dark region on the substrate in the inspection process.
Figure 5:
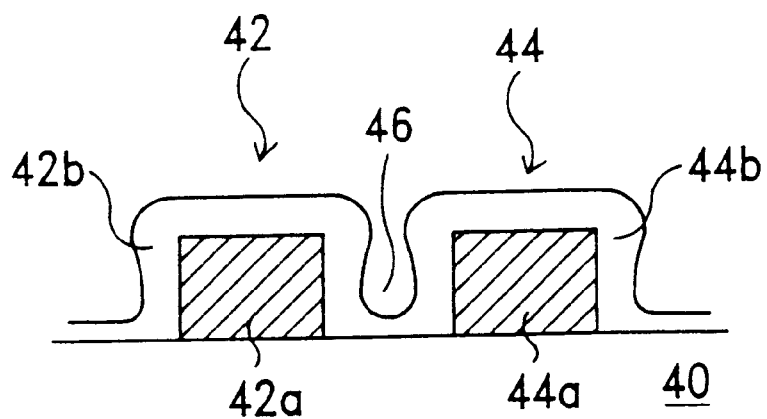
FIG. 5 is a cross-sectional view of a semiconductor substrate with island structures formed over in accordance with the present invention.

Referring to FIG. 5, a semiconductor substrate 40 is provided with island structures 42 and 44 formed thereon. The island structures 42 and 44 can be conductive structures. The conductive structures 42 and 44 can be a last layer of interconnection networks formed on the substrate 40. Thus other connection layers, dielectric layers, and devices which are not shown in the figure, can be included in the substrate 40 underlying the conductive structures 42 and 44.

In general, the conductive structures 42 and 44 include conductive paths 42*a* and 44*a* with passivations 42*b* and 44*b* conformably covered over. The conductive paths 42*a* and 44*a* can be formed with conductive materials like metal, polysilicon, or the combination. The passivations 42*b* and 44*b* are typically oxide or nitride passivations. After the formation of the passivations 42*b* and 44*b*, numerous spaces between the conductive structures 42 and 44 are left, such as the space 46 indicated in the figure. As described in the background of the invention, the left-over spaces can be frequently observed at corner regions where the conductive structures make turns, or at the end-point regions of the conductive structures. In the present sub-micron processes, the space 46 can be observed with a width of about 0.5 micron to 2 micron left over. With different feature sizes and island-to-island spaces, the width can be varied within a greater range.

Figure 6:
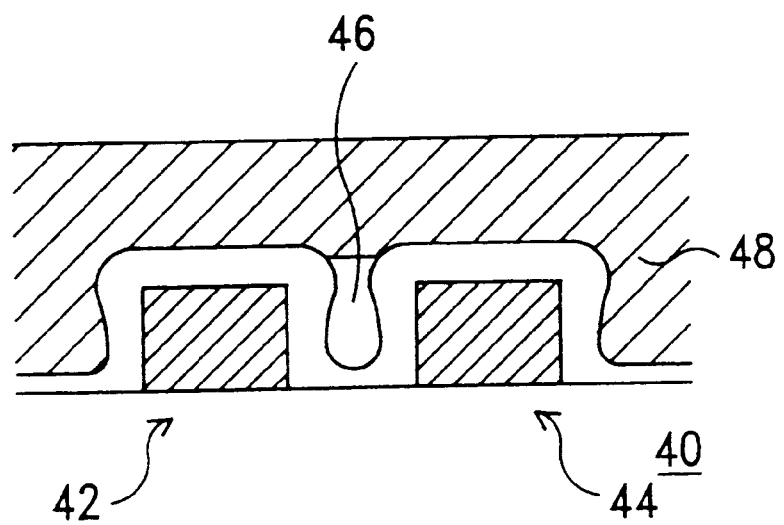
FIG. 6 is a cross-sectional view of forming a first buffer layer over the island structures and the substrate in accordance with the present invention.

Turning to FIG. 6, a first buffer layer 48 is formed over the island structures 42 and 44. With the narrow top opening of the space 46, the first buffer layer 48 is hard to form within the space and the space 46 is thus left unfilled. In the preferred embodiment, a polyimide layer is used as the first buffer layer 48. Polyimide can also be used as a second buffer layer, which will be described later. In the case of using polyimide as a top buffer layer over the conductive structures, the induced stress on a chip of integrated circuits during the packaging process can be reduced. The polyimide buffer layer relieves the stress to the underlying layers and devices, thus stress-induced cracks and damage caused by the packaging process can be eliminated. In addition, the polyimide buffer layer is a good alpha-particle barrier. Therefore, the soft errors of integrated circuits with memory devices can be reduced. In most applications of the present manufacturing process, the polyimide layer can be formed by coating or spinning on a photosensitive polyimide precursors (polyamic acids).

Figure 7:
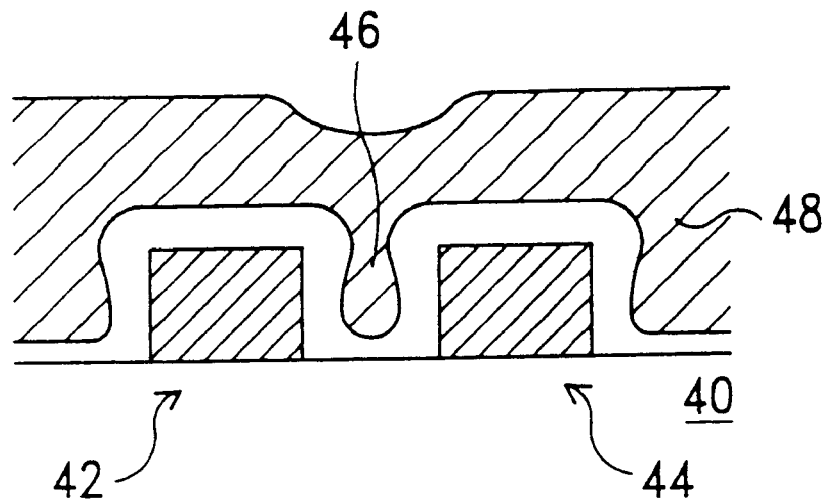
FIG. 7 is a cross-sectional view of reflowing the first buffer layer into spaces between the island structures in accordance with the present invention.

A first reflow process is then performed for reflowing the first buffer layer 48, as shown in FIG. 7. The spaces between the island structures, such as space 46, is filled by flowing the first buffer layer 48 within. In general, the reflow process is a thermal soft-bake process. The soft-bake process can be performed by heating the substrate 40 with a hot plate at about 60° C. to about 110° C., for about 60 seconds to about 120 seconds or longer.

Figure 8:
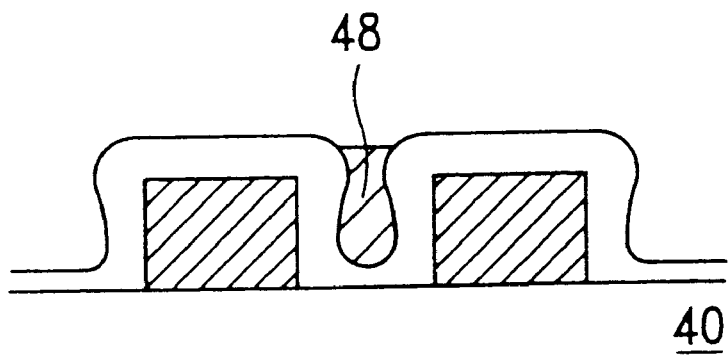
FIG. 8 is a cross-sectional view of removing a portion of the first buffer layer located outside the spaces in accordance with the present invention.

Turning to FIG. 8, a portion of the first buffer layer 48 located outside the space 46 is are then removed. In the case, the step can be simply achieved by a clean process. In general, a buffer layer dissolving solution or agent is sprayed onto the substrate 40. Since the polyimide is a negative photoresist, an organic solvent such as a negative developer can be used. Thus, the portion of the first buffer layer 48 located outside the space 46 is dissolved and cleaned. The space 46 remains filled with the first buffer layer 48. The solution can be a volatile solvent and thus is evaporated after the cleaning process.

Figure 9:
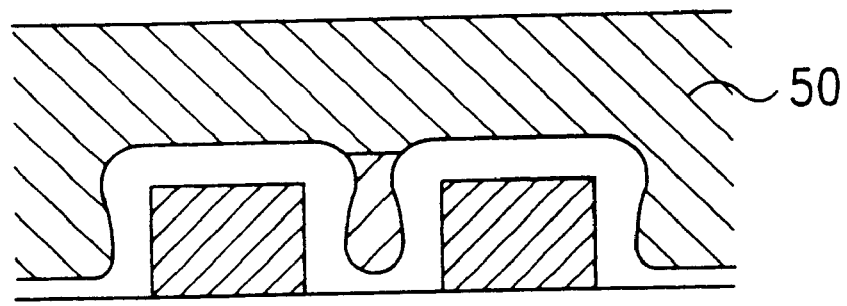
FIG. 9 is a cross-sectional view of forming a second buffer layer over the first buffer layer and the island structures in accordance with the present invention.

Next, a second buffer layer 50 is formed over the first buffer layer 48 and the island structures 42 and 44, as shown in FIG. 9. A polyimide layer can be used as the second buffer layer 50 as well. As the characteristics identified above, the polyimide buffer layer relieves the stress and serves as a good alpha-particle barrier to reduce soft errors. In the same way, the polyimide layer can be formed by coating or spinning a photosensitive polyimide precursors (polyamic acids).

Figure 10:
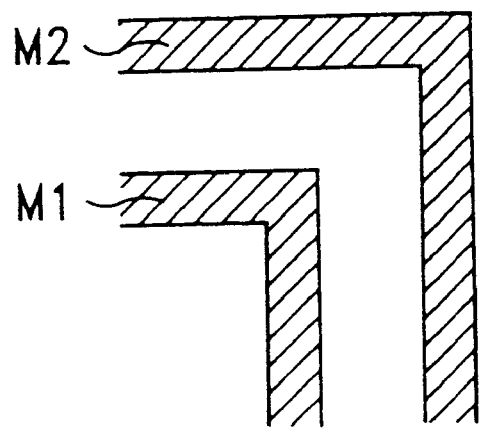
FIG. 10 is a top view of the substrate formed without dark regions in the inspection process in accordance with the present invention.

For performing a patterning process with the second buffer layer 50 as a photoresist layer, a second thermal soft-bake process is performed to the second buffer layer 50 at first. Since the space 46 is filled with the first buffer layer, the reflow problem of the second buffer layer 50 into the unfilled space in the conventional soft-bake process is eliminated. Thus a recess-free second buffer layer 50 can be formed. Turning to FIG. 10, the presentation of a dark region or a black region from a top view of the substrate 40 is eliminated in the inspection process. Thus the surface condition of the substrate 40 can be clearly identified to find the true falures of the process and the inspection efforts can be greatly reduced.

After the second thermal soft-bake process, a patterning process is then employed to the second buffer layer 50 to remove the defined regions. Thus the top buffer layer of the wafer is formed and defined.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of forming a recess-free buffer layer on a semiconductor substrate, said substrate having island structures formed thereon, said method comprising the steps of:

forming a first buffer layer over said island structures and said substrate, wherein spaces between said island structures are small enough so that said formed first buffer layer cannot substantially fill up the spaces;

performing a reflow process for reflowing said first buffer layer into the spaces between said island structures;

removing a portion of said first buffer layer located outside said spaces; and forming a second buffer layer over said first buffer layer and said island structures.

2. The method of claim 1 further comprises a step of performing a thermal soft-bake process on said second buffer layer.

3. The method of claim 2 further comprises a step of performing a patterning process to said second buffer layer after said thermal soft-bake process.

4. The method of claim 1, wherein said island structures comprise conductive structures.

5. The method of claim 4, wherein said conductive structures comprise conductive paths with passivations covered over.

6. The method of claim 1, wherein said first buffer layer comprises a polyimide layer.

7. The method of claim 1, wherein said second buffer layer comprises a polyimide layer.

8. The method of claim 1, wherein said reflow process comprises a second thermal soft-bake process.

9. The method of claim 1, wherein said step of removing said portion of said first buffer layer is performed by a clean process.

10. The method of claim 9, wherein said clean process comprises spraying a buffer layer dissolving solution over said first buffer layer.

11. A method of forming a recess-free buffer layer on a semiconductor substrate, said substrate having conductive structures formed thereon, said method comprising the steps of:

forming a first buffer layer over said conductive structures and said substrate, wherein spaces between said conductive structures are dimensioned small enough so that said formed first buffer layer cannot substantially fill up the spaces;

performing a first soft-bake process for reflowing said first buffer layer into spaces between said conductive structures;

performing a clean process to remove a portion of said first buffer layer located outside said spaces;

forming a second buffer layer over said first buffer layer and said conductive structures; and performing a second soft-bake process to said second buffer layer.

12. The method of claim 11 further comprises a step of performing a patterning process to said second buffer layer after said soft-bake process.

13. The method of claim 11, wherein said conductive structures comprise conductive paths with passivations covered over.

14. The method of claim 11, wherein said first buffer layer comprises a polyimide layer.

15. The method of claim 11, wherein said second buffer layer comprises a polyimide layer.

16. The method of claim 11, wherein said clean process comprises spraying a buffer layer dissolving solution over said first buffer layer.

* * * * *